United States Patent
Chang et al.

[11] Patent Number: 5,910,669
[45] Date of Patent: Jun. 8, 1999

[54] FIELD EFFECT TRENCH TRANSISTOR HAVING LIGHTLY DOPED EPITAXIAL REGION ON THE SURFACE PORTION THEREOF

[75] Inventors: Mike F. Chang, Cupertino; Fwu-Iuan Hshieh, San Jose; Sze-Hon Kwan, San Francisco; King Owyang, Atherton, all of Calif.

[73] Assignee: Siliconix incorporated, Santa Clara, Calif.

[21] Appl. No.: 07/918,954

[22] Filed: Jul. 24, 1992

[51] Int. Cl.[6] .................. H01L 29/76; H01L 29/94; H01L 31/062; H01L 31/113
[52] U.S. Cl. .................. 257/339; 257/329; 257/330; 257/342
[58] Field of Search .................. 257/327, 329, 257/330, 331, 335, 339, 341, 342, 409, 344

[56] References Cited

U.S. PATENT DOCUMENTS

| | | | |
|---|---|---|---|
| 4,593,302 | 6/1986 | Lidow et al. | 357/23.4 |
| 4,680,853 | 7/1987 | Lidow et al. | 29/571 |
| 4,803,532 | 2/1989 | Mihara et al. | 357/234 |
| 4,941,026 | 7/1990 | Temple | 257/339 |
| 5,072,266 | 12/1991 | Bulucea et al. | 257/339 |
| 5,138,422 | 8/1992 | Fujii et al. | 357/49 |
| 5,168,331 | 12/1992 | Yilmaz | 257/339 |

FOREIGN PATENT DOCUMENTS

| | | | |
|---|---|---|---|
| 0345380 | 12/1989 | European Pat. Off. | 257/330 |
| 55-146976 | 11/1980 | Japan | 257/339 |
| 56-58267 | 5/1981 | Japan | 257/335 |
| 59-84474 | 5/1984 | Japan | 257/329 |
| 62-176168 | 8/1987 | Japan | 257/342 |
| 1-42177 | 2/1989 | Japan | 257/339 |

*Primary Examiner*—Steven H. Loke
*Attorney, Agent, or Firm*—Skjerven, Morrill, MacPherson, Franklin & Friel LLP; Norman R. Klivans

[57] ABSTRACT

A DMOS field effect transistor having its gate electrode located in a trench includes a lightly doped epitaxial layer overlying the usual epitaxial layer. The trench penetrates only part way through the upper epitaxial layer which is more lightly doped than is the underlying lower epitaxial layer. The lightly doped upper epitaxial layer reduces the electric field at the bottom of the trench, thus protecting the gate oxide from breakdown during high voltage operation. Advantageously the upper portion of the lightly doped upper epitaxial layer has little adverse effect on the transistor's on resistance.

7 Claims, 3 Drawing Sheets

FIELD EFFECT TRENCH TRANSISTOR HAVING LIGHTLY DOPED EPITAXIAL REGION ON THE SURFACE PORTION THEREOF

BACKGROUND OF THE INVENTION

1. Field of the Invention

This invention is directed to field effect transistors, and especially to field effect transistors for power applications and in which the transistor gate is located in a trench in a substrate having a lightly doped epitaxial layer at the principal surface of the substrate.

2. Description of the Prior Art

DMOS transistor (double diffused MOS transistors) are well known as a type of field effect transistor. A typical such transistor shown in FIG. 1 includes a substrate 10 doped N+, an epitaxial layer 14 formed thereon doped N−, a body region 16 doped P, and a source region 20 doped N+. The gate electrode 22 is typically conductive polysilicon formed in a trench 24 which may be V-shaped, U-shaped, or a truncated V as shown in FIG. 1. The source contacts 26 short the body region 16 to the source region 20, and the drain contact 30 is formed on the substrate 10 backside. The channel length designated by X is the length of the P body region 16 adjacent to the gate electrode 22. It is to be understood that the structure of FIG. 1 is illustrative; in other devices which are also well known, the trench 24 is completely filled with the gate electrode 22, thus establishing a planar principal surface.

It is considered critical to the performance of such a device that a narrow channel be available. The channel region of such a device is the P body diffusion. To achieve low channel resistance, this region is kept short. It is important that the trench extends slightly beyond the depth of the P body region.

It is known that undesirably very high electric fields form at the bottom of the trench, resulting in a significant reduction in the breakdown voltage. That is to say, when such a device is operated at high voltage, the sharp corners inside the etched trench make reliable high voltage performance difficult due to local electric fields.

That is to say, in such a device, a high electric field around the bottom corners of the trench (also called a groove) causes premature device breakdown. This breakdown can damage the gate oxide layer and even result in permanent damage to the device. It would be highly desirable to overcome this shortcoming to achieve higher breakdown voltage without excessively increasing source-drain on resistance (RDSON).

SUMMARY OF THE INVENTION

In accordance with the invention, a lightly doped second epitaxial region is formed on the top portion of the usual epitaxial layer. The upper epitaxial layer extends slightly deeper than the bottom of the trench, and the upper epitaxial layer is less doped than is the underlying epitaxial layer. Thus the lightly doped upper epitaxial layer reduces the electric field around the bottom of the trench, to protect the gate oxide in the trench from breakdown during high voltage operation.

As the transistor is turned on, current flows down the surface of the trench through the channel, i.e. along the side of the trench adjacent to the P body region, to the lower portion of the trench surface, and spreading from the bottom surface of the trench down to the drift region (the second epitaxial layer) and to the drain region (the substrate).

The upper portion of the lightly doped top epitaxial layer has little adverse impact on the source-drain on resistance. The portion of the upper epitaxial layer that extends below the bottom of the trench does undesirably contribute some extra on resistance. However, since this portion of the upper epitaxial layer is very thin, the added on resistance is small. Thus the tradeoff between increased breakdown voltage and increased on resistance is favorable. The structure in accordance with the invention can be achieved through a modified epitaxial growth process without significant extra cost or additional masking steps, and is efficiently controlled using conventional semiconductor processing equipment.

DETAILED DESCRIPTION OF THE INVENTION

Figure 2:
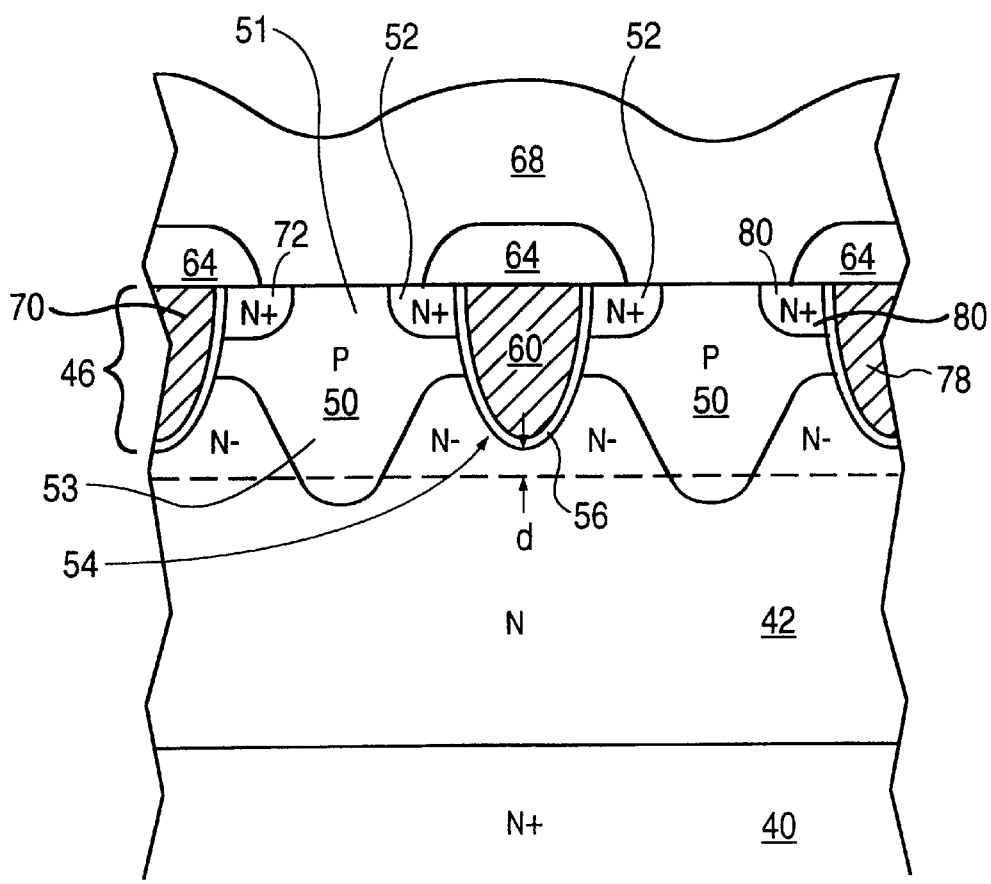
FIG. 2 shows a transistor in accordance with the present invention.

FIG. 2 shows a single transistor in accordance with the present invention. It is to be understood that as is shown at the left and right hand portions of FIG. 2, the structure is replicated in the typical cell-like power transistor structure to provide many such transistors connected in parallel, typically for power switching applications. The chief application of DMOS transistors is for power switching; however, the present invention is not limited thereto.

The transistor of FIG. 2 includes conventional heavily doped N+ substrate 40 and an N doped epitaxial layer 42, the doping concentration of which is strongly dependent on the voltage application. The doping level (phosphorous or arsenic) of N+ substrate 40 is $6 \times 10^{18}$ to $1 \times 10^{20}$ ion/cm$^2$. The doping level (arsenic or phosphorous) of the lower N epitaxial layer 42 is such as to achieve a sheet resistance of approximately 0.5 to 1.0 ohms·cm. (It is to be understood that the polarities herein would be reversed for a P-channel device, as against the present N-channel device.) The thickness of the lower epitaxial layer 42, is approximately 3 to 8 microns (micrometers), depending on different applications.

Formed on the lower epitaxial layer 42 is a more lightly doped second (upper) epitaxial layer 46 which is arsenic doped N such as to achieve a sheet resistance of approximately 1.0 to 2.0 ohms·cm. Thus the resistivity of the upper epitaxial layer 46 is typically twice that of the lower epitaxial layer 42; hence the doping level of the upper layer is about half that of the lower layer. The thickness of the upper epitaxial layer 46 is approximately 2 to 3 microns. Formed in the upper epitaxial layer 46 is the P doped body region 50. The P doped body region 50 includes a shallow P channel region 51 and a deep P+ region 53. The shallow P channel region 51 is doped to a level of approximately $2 \times 10^{13}$ to $1 \times 10^{14}$ ion/cm$^2$, while the deep P+ region 53 is doped to $5 \times 10^{14}$ to $1 \times 10^{16}$ ion/cm$^2$. Also formed in layer 46 is an N+ source region 52 doped to a level of approximately $6 \times 10^{14}$ to $1 \times 10^{16}$ ion/cm$^2$ using again arsenic or phosphorous. The depth of the N+ source region 52 is approximately 0.3 to 0.5 microns. The P body region 50 extends down approximately 0.5 to 1.5 microns into the lower epitaxial layer 42 (as shown).

The U-shaped trench 54 is conventionally lined with gate oxide 56 and then filled with doped polysilicon 60. The sheet resistance of the doped polysilicon 60 is approximately 20 to 40 ohm/square using phosphorous chloride as the dopant.

Conventionally formed over the principal surface of the device is insulating gate oxide layer 64 and overlying that is the conventional aluminum metallization layer 68 which contacts the source 52 and body regions 50. It is to be understood that the additional gate structures and source regions 70, 72 and 78, 80 shown respectively in the left hand and right hand portions of FIG. 2 are portions of adjacent identical transistor cells. Substrate 40 serves as a drain region and is conventionally contacted by metallization formed on the backside of substrate 40 (not shown).

Figure 1:
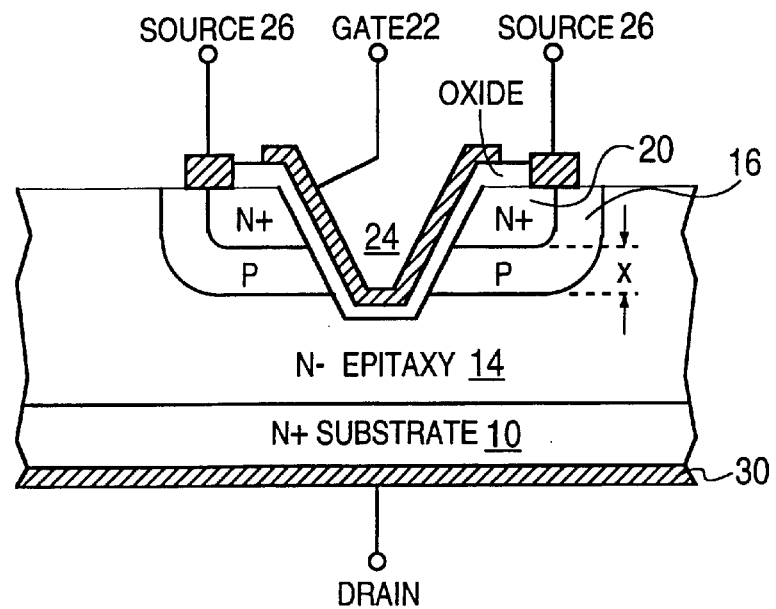
FIG. 1 shows a prior art DMOS trenched field effect transistor.

Therefore, unlike what is shown in FIG. 1, in the structure of FIG. 2, the P body region 50 extends lower than the depth of the trench 54. However, it does not so extend at the portions immediately adjacent to the bottom portion of the trench 54, but only at locations spaced away from the bottom portion of the trench 54. In FIG. 2 the trench is conventionally U-shaped, i.e. having approximately vertical walls.

It is to be understood that the present invention is also applicable to transistors having a V-shaped or a truncated V-shaped trench.

The structure of FIG. 2 intentionally reduces the doping concentration at the lower corners of the trench 54, thus locally reducing the strength of the electric fields. This is achieved by providing the lightly doped upper epitaxial region 46 adjacent to the bottom portions of the trench 54. In one embodiment, trench 54 is approximately 1.5 microns deep, leaving a distance "d" of approximately 0.5 microns between the bottom of trench 54 and the upper surface of lower epitaxial layer 42. This distance d is established to avoid early breakdown even at the trench corners. Since the deep P+ body region extends down into the lower epitaxial layer 42, this results in P-N junction breakdown to eliminate walk-out phenomena. The structure shown in FIG. 2 is illustrative for a transistor for applications of up to 60 volts.

Figure 3A:
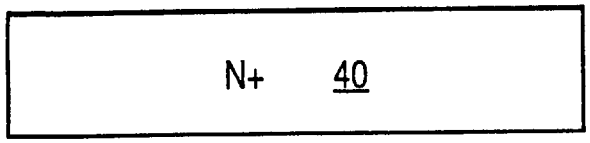
FIGS. 3a through 3g show process steps to form the transistor of FIG. 2.
Figure 3B:
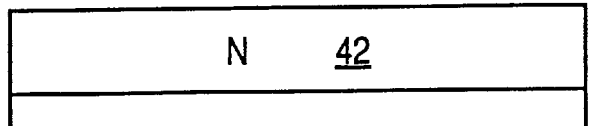
Figure 3C:
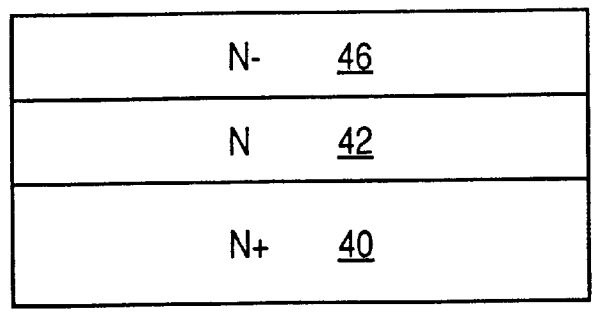

Fabrication of the structure of FIG. 2 is illustrated in FIGS. 3a to 3g. In FIG. 3a, one begins conventionally with an N+ doped substrate 40. Then one conventionally grows a first epitaxial layer 42 doped N type to a level of about 0.5 to 1.2 ohms·cm as shown in FIG. 3b. Then as shown in FIG. 3c a second epitaxial layer 46 is grown on the first epitaxial layer 42, the second epitaxial layer 46 being more lightly doped to a level of approximately 1.0 to 2.0 ohms·cm. All three regions 40, 42, 46 are doped using arsenic or phosphorous with arsenic preferred. The two epitaxial layers 42, 46 have a thickness of approximately 3 to 8 microns $\mu$m, and 2 to 3 microns, respectively.

Figure 3D:
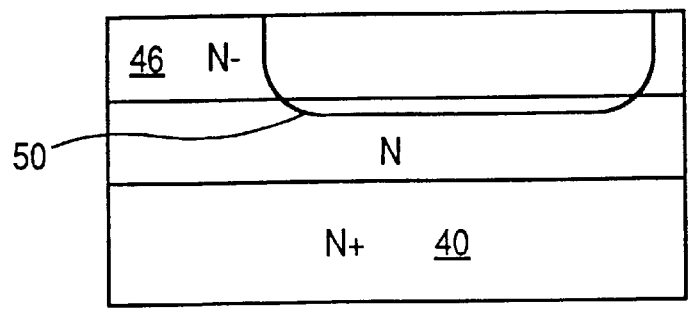

Then as shown in FIG. 3d, by a conventional masking step, the shallow P body in region 50 is formed by boron implantation at 60 keV using a dose of $2\times10^{13}$ to $1\times10^{14}$ ion/cm$^2$. This implantation is then driven into a depth of approximately 1.0 to 2.0 microns. The deep P body in region 50 is then implanted in the central portion of the transistor using an implant dose of boron of $5\times10^{14}$ to $1\times10^{16}$ ion/cm$^2$ at an energy of 60 KeV. This implantation is then driven in to a depth of approximately 2.0 to 3.5 microns.

Alternatively, the deep P body in region 50 can be formed with a boron nitride process. The resulting sheet resistance is about 20 to 100 ohm/square.

Figure 3E:
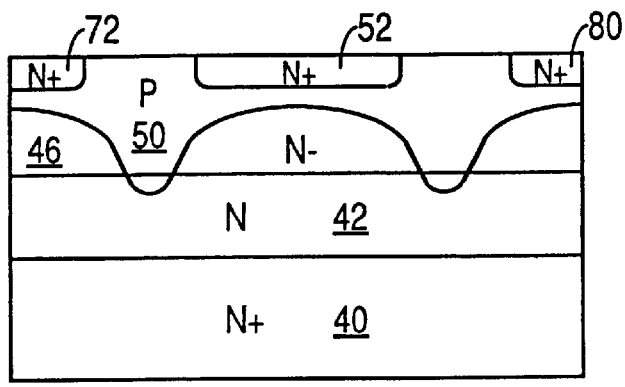

Then as shown in FIG. 3e the N+ region 52 is conventionally implanted using a mask. The implantation is at an energy of 80 KeV and a dosage of $6\times10^{15}$ to $1\times10^{16}$ ion/cm$^2$, again using arsenic or phosphorous. The N+ region 52 is then driven in (diffused) to a depth of approximately 0.3 to 0.5 microns. (Also shown are N+ source regions 72, 80 of adjacent transistors which are formed simultaneously).

Figure 3F:
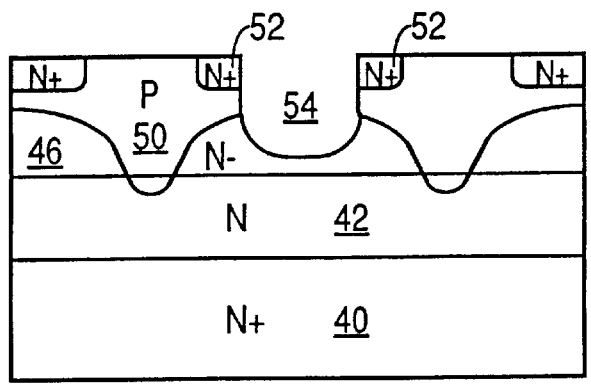
Figure 3G:
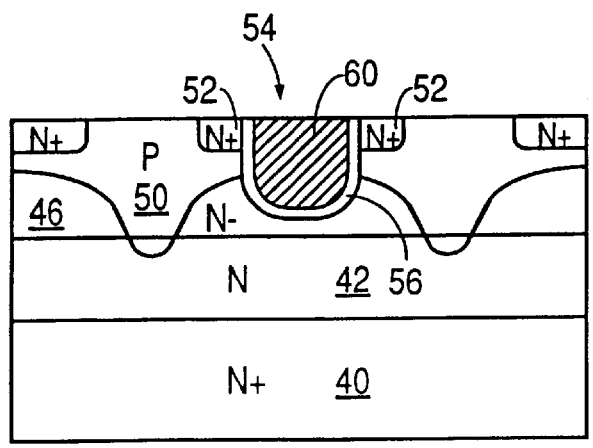

Then as shown in FIG. 3f, a U-shaped trench 54 is conventionally reactive ion etched through the central portion of the source region 52 into the body region 50 to a depth of approximately 1.0 to 2.0 microns.

The trench 54 is then conventionally lined (see FIG. 3g) with silicon dioxide 56 by thermal growth of silicon dioxide on the trench walls to a thickness of approximately 500 to 1000 Å. Then the lined trench 54 is conventionally filled with polycrystalline silicon 60 which is then doped with phosphorous chloride to a sheet resistance of approximately 20 to 40 ohms/square. Then (not shown) an insulating (e.g. BPSG) layer is conventionally deposited and patterned for insulating the gate electrode. Then (not shown) the aluminum metallization layer is conventionally formed thereover, establishing electrical contact to the body and source regions.

It is to be understood that the final configuration of the device as shown in FIG. 2 with regard to channel length is a result of the double diffusion, i.e. diffusing the N+ source region 52 after establishing the P body region 50.

The structure of FIG. 2 may be formed by methods and materials other than as described above, so long as they result in two upper layers of the substrate, the upper most layer having a lower doping level than the layer immediately beneath it. This is most easily achieved through the above described double epitaxial layer growth, but other methods of establishing such a structure will be apparent to one of ordinary skill in the art.

For instance:

(1) the P channel region may be formed after trench formation and planarization; or (2) the upper epitaxial layer 46 may be formed by implantation of boron into the epitaxial layer 42; or (3) other semiconductor materials might be used in place of silicon, for instance gallium arsenide.

The above description is illustrative and not limiting; further modifications will be apparent to one of ordinary skill in the art in light of this specification and the appended claims.

We claim:

1. A field effect transistor comprising:

a substrate of a first conductivity type being a drain region;

a lower layer of the first conductivity type formed on the substrate and having a doping level less than that of the substrate;

an upper layer of the first conductivity type formed on the lower layer and having a doping level less than that of the lower layer;

a trench defined in only the upper layer and extending to within a predetermined distance of the lower layer, the trench being at least partially filled with a conductive gate electrode;

a source region of the first conductivity type formed in the upper layer and extending to a principal surface of the upper layer and lying adjacent to the sidewalls of the trench; and a body region of a second conductivity type extending from the principal surface of the upper layer down to and into at least an upper portion of the lower layer and being spaced apart from the lower portion of the trench, wherein two spaced apart portions of the body region lying respectively on two sides of the trench define a lateral extent of the upper layer.

2. The device of claim 1, wherein the trench is U-shaped in cross-section.

3. The device of claim 1, wherein the upper layer extends about 0.5 microns below the lowest portion of the trench.

4. The device of claim 1, wherein the upper layer has a doping level about 50% that of the lower layer.

5. The device of claim 1, wherein the upper and lower layers are each less than about 8 $\mu$m thick.

6. The device of claim 1, wherein the upper and lower layers are epitaxial layers.

7. A field effect transistor comprising:

a substrate of a first conductivity type being a drain region;

a first layer of the first conductivity type formed on the substrate and having a doping level less than that of the substrate;

a second layer of the first conductivity type formed on the first layer and having a doping level about 50% of that of the first layer;

a trench defined in only the second layer and extending to within about 0.5 $\mu$m of the first layer, the trench being at least partially filled with a conductive gate electrode;

a source region of the first conductivity type formed in the second layer and extending to a principal surface of the second layer and lying adjacent to the sidewalls of the trench; and a body region of a second conductivity type extending from the principal surface of the second layer down to and into at least an upper portion of the first layer and being spaced apart from the lower portion of the trench, wherein two portions of the body region lying respectively on two sides of the trench define a lateral extent of the second layer.

* * * * *